US009122833B2

(12) United States Patent
Chen et al.

(10) Patent No.: US 9,122,833 B2
(45) Date of Patent: Sep. 1, 2015

(54) METHOD OF DESIGNING FIN FIELD EFFECT TRANSISTOR (FINFET)-BASED CIRCUIT AND SYSTEM FOR IMPLEMENTING THE SAME (71) Applicant: TAIWAN SEMICONDUCTOR MANUFACTURING COMPANY, LTD., Hsinchu (TW)

(72) Inventors: Chin-Sheng Chen, Taoyuan (TW); Tsun-Yu Yang, Changhua (TW); Wei-Yi Hu, Zhubei (TW); Jui-Feng Kuan, Zhubei (TW); Ching-Shun Yang, Zhudong Township (TW); Yi-Kan Cheng, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/086,127

(22) Filed: Nov. 21, 2013

(65) Prior Publication Data
US 2015/0143314 A1 May 21, 2015

(51) Int. Cl.
G06F 17/50 (2006.01)
(52) U.S. Cl.
CPC ........ *G06F 17/5081* (2013.01); *G06F 17/5009* (2013.01)

(58) Field of Classification Search
CPC ............ G06F 17/5081; G06F 17/5009; G06F 17/5045; G06F 17/5036; G06F 2217/10; H01L 29/00
USPC .................................................. 716/110–116
See application file for complete search history.

(56) References Cited

U.S. PATENT DOCUMENTS 8,826,213 B1 * 9/2014 Ho et al. ........................ 716/122
2013/0239077 A1 * 9/2013 Wang et al. ................... 716/111

* cited by examiner

Primary Examiner — Binh Tat
(74) Attorney, Agent, or Firm — Lowe Hauptman & Ham, LLP (57) ABSTRACT A method of designing a fin field effect transistor (FinFET)-based circuit includes designing, using a processor, a first circuit schematic design based on a performance specification, the first circuit schematic design is free of artificial elements, wherein the artificial elements are used to simulate electrical performance of the FinFET-based circuit. The method further includes modifying, using the processor, at least one device within the first circuit schematic design to form a second circuit schematic design taking the artificial elements into consideration. The method further includes performing a pre-layout simulation using the second circuit schematic and taking the artificial elements into consideration. The method further includes generating a layout, wherein the layout does not take the artificial elements into consideration, and performing a post-layout simulation, wherein the post-layout simulation does not take the artificial elements into consideration.

20 Claims, 7 Drawing Sheets

METHOD OF DESIGNING FIN FIELD EFFECT TRANSISTOR (FINFET)-BASED CIRCUIT AND SYSTEM FOR IMPLEMENTING THE SAME

BACKGROUND

Circuit designers receive circuit performance requirements from a customer and design circuits capable of satisfying the performance requirements. Circuits are designed using computer programs which help the circuit designers simulate a performance of the designed circuits.

During design of a circuit, resistance and capacitance between neighboring devices and conductive elements are taken into account in order to more accurately predict a performance of the circuit. As node sizes decrease, spacing between the neighboring devices and conductive elements also decreases which increases an impact of resistance and capacitance on performance of the circuit.

For circuits based on fin field effect transistor (FinFET) devices, circuit designers create two separate schematics. One schematic includes artificial elements which are not part of the actual circuit design. These artificial elements are used to help account for the resistance and capacitance between the neighboring devices and connections. Another schematic does not include the artificial elements and is used to help arrange devices within the circuit. The two schematics are refined using an iterative process which includes making modifications to both schematics to remove discrepancies between the schematics and satisfy the performance requirements.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The Figures of the present disclosure comprise.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
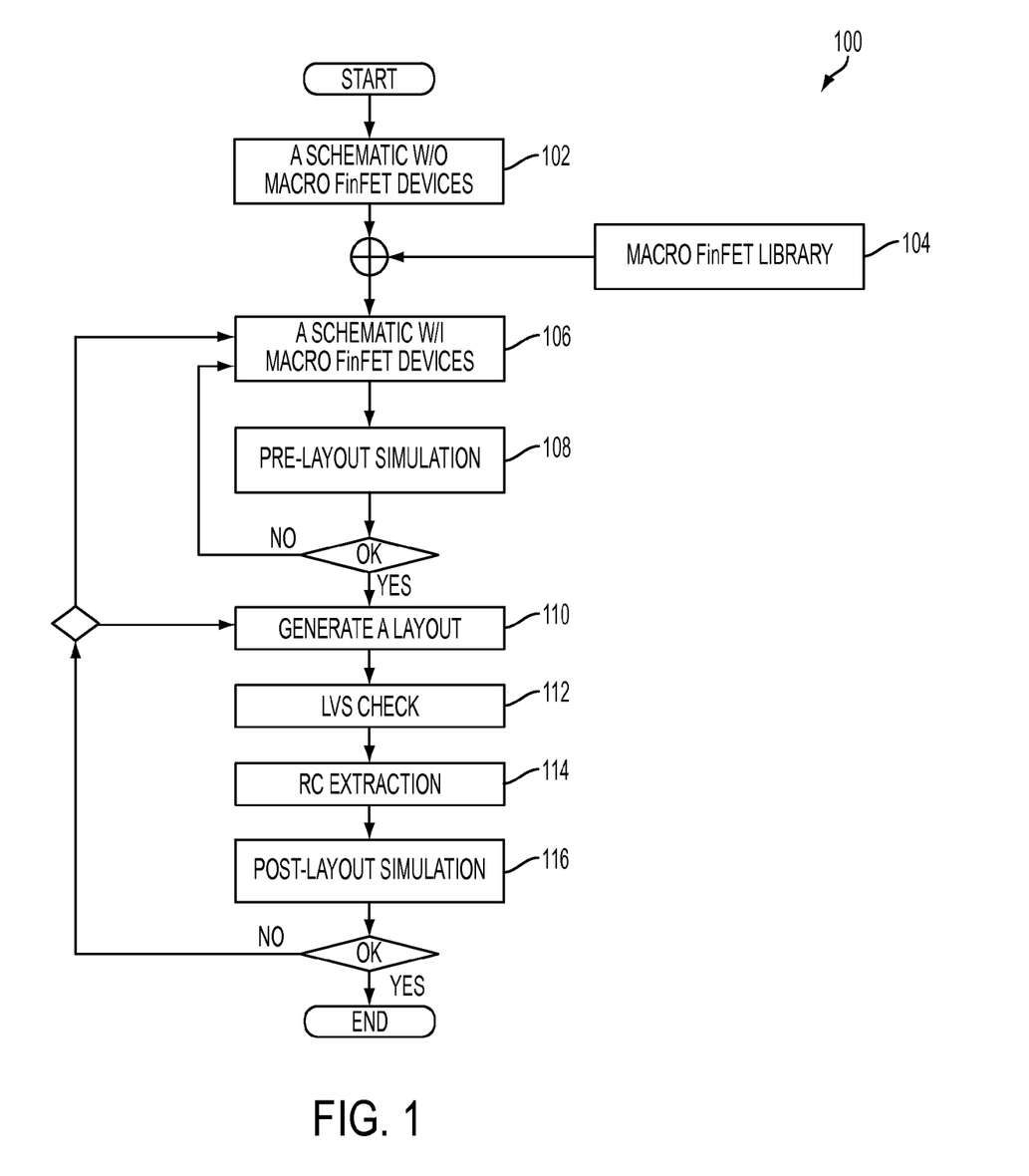
FIG. 1 is a flow chart of a method of designing a fin field effect transistor (FinFET)-based circuit in accordance with one or more embodiments.

FIG. 1 is a flow chart of a method 100 of designing a fin field effect transistor (FinFET)-based circuit in accordance with one or more embodiments. Method 100 begins with operation 102 in which a schematic design which does not include artificial elements is designed. A circuit designer receives a performance specification from a customer. The circuit designer creates the schematic design in order to satisfy the performance specification. The schematic design initially does not include the artificial elements used to simulate the effect of neighboring devices and conductive elements in the schematic design. In at least some embodiments, the term performance specification is intended to encompass one or more performance specifications.

A macro FinFET library 104 is combined with the schematic design from operation 102 in order to account for resistance and capacitance effects of elements within each FinFET device and connections in the FinFET-based circuit. Macro FinFET library 104 is stored in a non-transitory computer readable medium. Macro FinFET library 104 includes a parameter cell (p-cell) symbol for both a pre-layout simulation and a layout versus schematic (LVS) simulation. Macro FinFET library 104 also includes a component description format (CDF) for each FinFET device. Macro FinFET library 104 includes simulated values for resistance and capacitance called RC bin values. In some embodiments, the RC bin values are determined using a commercial RC extraction tool. Based on modifications to the FinFET device and resulting RC bin values, the artificial elements are designed to simulate the resistance and capacitance effects of the FinFET device. Macro FinFET library 104 is configured to store these artificial elements in combination with a specific FinFET device design, i.e., a specific dimension, a number of fingers, and other suitable artificial elements. In some embodiments, the artificial elements include polysilicon oxide diffusion edge (PODE) devices, middle end of line (MEOL) connections, back end of line (BEOL) connections, or other suitable RC devices which simulate RC effects within a FinFET device.

In operation 106, a schematic design which includes macro FinFET parameters is developed. By combining macro FinFET library 104 with the schematic design from operation 102, FinFET devices within the schematic diagram are modified to include the artificial elements which help to simulate the RC performance of the FinFET devices. The macro FinFET parameters enable a more accurate simulation of performance of the circuit in comparison with the schematic design from operation 102 due to the inclusion of the artificial elements.

A pre-layout simulation is performed in operation 108. The pre-layout simulation generates electrical characteristics or functional characteristics which are used to compare a performance of the schematic design with the performance specification from the customer. In some embodiments, the pre-layout simulation includes comparing I-V curves or current gains between the schematic design and the performance specification. In some embodiments, the pre-layout simulation includes simulating an output of the schematic design in response to a simulated input. The output is then compared against the performance specification.

Following the pre-layout simulation, if the results pre-layout simulation satisfy the performance specification, method 100 continues to operation 110. If the results of the pre-layout simulation do not satisfy the performance specification, method 100 returns to operation 106 and the schematic design is revised.

In operation 110, a layout is generated. The layout is a physical location of the devices and connections in the schematic design. The layout does not include the artificial elements used to simulate the RC performance in pre-layout simulation. In some embodiments, the layout is generated using a graphic database system (GDS). In some embodiments, the layout includes multiple layers. In some embodiments, generating the layout includes designing masks which are used to pattern a wafer to form the circuit. In some embodiments, a number of masks is equal to a number of layers in the layout. In some embodiments, more than one mask is used to form at least one layer of the layout. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

In some embodiments, the netlist includes materials and dimensions of the various devices and connections in the schematic design. For example, a netlist describing a transistor includes a gate width, a gate length, a location of terminals of the transistor, a number of fingers, or other suitable parameters used to describe the transistor.

In some embodiments, a design rule check (DRC) is performed during generation of the layout. The DRC is used to maintain sufficient spacing between features in the layout so that the layout can be precisely formed during a fabrication process. In some embodiments, a same tool used to generate the layout is used to perform the DRC. In some embodiments, the DRC is performed by a separate tool following generation of the layout.

In operation 112, an LVS check is performed. The LVS check compares the layout with the schematic design to help ensure the layout accurately represents the circuit as designed by the circuit designer. The LVS check does not account for the artificial elements in the schematic design. In some embodiments, the LVS check includes extracting a layout netlist from the layout design. The extracted layout netlist does not include the artificial elements. In some embodiments, the extracted layout netlist includes nodes corresponding to the device, e.g., a gate (G), a drain (D), a source (S) and a bulk (B) for a transistor. In some embodiments, the extracted layout netlist is compared with the schematic design to determine whether the layout matches the schematic design.

In operation 114, an RC extraction is performed. In some embodiments, the RC extraction extracts electrical performance information from the layout. In some embodiments, the RC extraction is performed based on the extracted layout netlist. In some embodiments, the RC extraction applies the extracted information to various device models to determine the electrical characteristics of the layout generated in operation 110. The RC extraction accounts for both the active devices and interconnect structures used to connect various active devices together. In some embodiments, a layout parasitic extraction (LPE) is performed in combination with the RC extraction. The LPE extracts information about the active devices from the layout instead of relying on a netlist.

A post-layout simulation is performed in operation 116. The post-layout simulation determines the performance of the circuit in the layout of operation 110 and compares the performance with the performance specification received from the customer. In some embodiments, the post-layout simulation is performed using a post-layout simulator such as HSPICE® available from SYNOPSYS, Inc.; SPECTRE® available from CADENCE DESIGN SYSTEMS, Inc.; or other suitable post-simulation tools.

If the post-layout simulation determines that the layout satisfies the performance specification, the layout is transferred to the production stage to begin fabrication of masks used to create the layout. If the post-layout simulation determines that the layout does not satisfy the performance specification, at least one of the layout or the schematic design is revised to address the failure to satisfy the performance specification.

Using method 100 helps to reduce time and resources during designing of a FinFET-based circuit in comparison with methods which do not include the macro FinFET parameters. Instead of developing two separate schematic designs, the circuit designer develops a single schematic design and macro FinFET library 104 is used to modify the schematic design to take into consideration the artificial elements to help simulate RC performance of the circuit. Macro FinFET library 104 allows switching between the p-cell schematic which include the artificial elements in order to facilitate RC extraction and a p-cell schematic free of the artificial elements for layout generation and evaluation. The ability to easily switch between different p-cell schematics helps to avoid a circuit designer inadvertently leaving a schematic design in a parasitic mode. Leaving a design in the parasitic mode during the post-layout simulation would result in considering the parasitic RC values of the artificial elements twice, which would reduce the accuracy of simulation.

Figure 2:
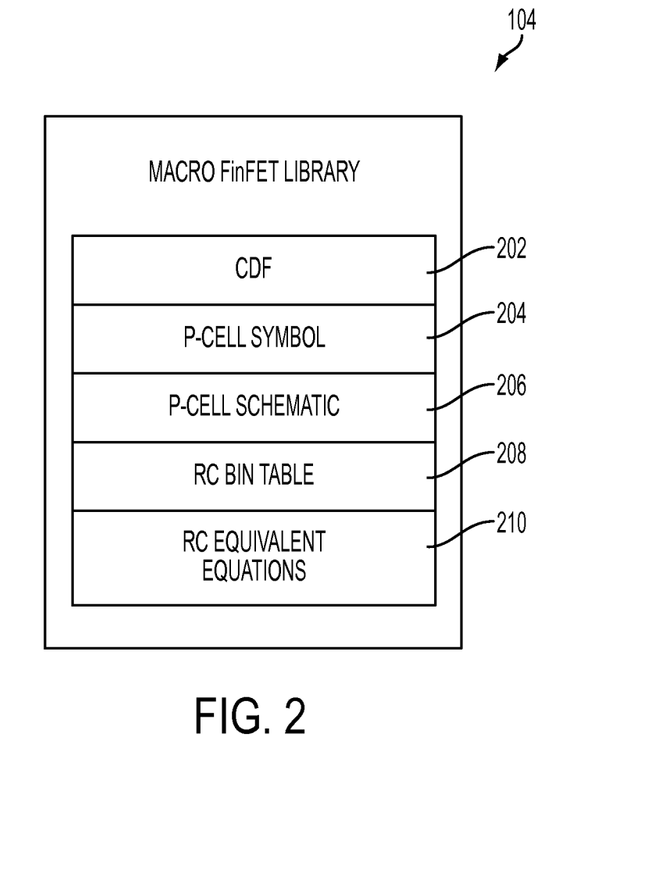
FIG. 2 is a block diagram of a macro FinFET library in accordance with one or more embodiments.

FIG. 2 is a block diagram of macro FinFET library 104 in accordance with one or more embodiments. Macro FinFET library 104 is stored in a non-transitory computer readable medium. Macro FinFET library 104 includes CDF 202, p-cell symbol 204, p-cell schematic 206, RC bin values 208 and RC equivalent equations 210. Macro FinFET library 104 includes parameters for a variety of FinFET devices such as an n-type transistor, a p-type transistor, resistors or other devices.

CDF 202 includes a structure for each FinFET device. In some embodiments, the structure includes both an inherit PDK FinFET device and the macro FinFET information, which includes the artificial elements.

P-cell symbol 204 includes both an icon for a parasitic mode and an icon for a layout mode. P-cell symbol 204 enables the circuit designer to easily identify whether the schematic design is in the parasitic mode or in the layout mode.

P-cell schematic 206 includes a schematic design for both the parasitic mode and the layout mode. The parasitic mode p-cell schematic 206 includes the artificial elements, such as PODE, MEOL, BEOL or other parasitic elements. The layout mode p-cell schematic 206 is free of the artificial elements.

RC bin values 208 are determined using a simulation tool in combination with different configurations of the FinFET device. The different configurations include different dimensions or different materials for the FinFET device. These different configurations create different parasitic effects in the FinFET device. These different parasitic effects are stored in macro FinFET library 104 for use in method 100.

RC equivalent equations 210 are determined based on RC bin values 208. RC equivalent equations 210 are used to determine the parasitic performance of the FinFET device. In some embodiment, RC equivalent equations 210 are linear. In some embodiments, RC equivalent equations 210 are non-linear. In some embodiments, RC equivalent equations 210 are used to interpolate between different RC bin values 208.

Figure 3A:
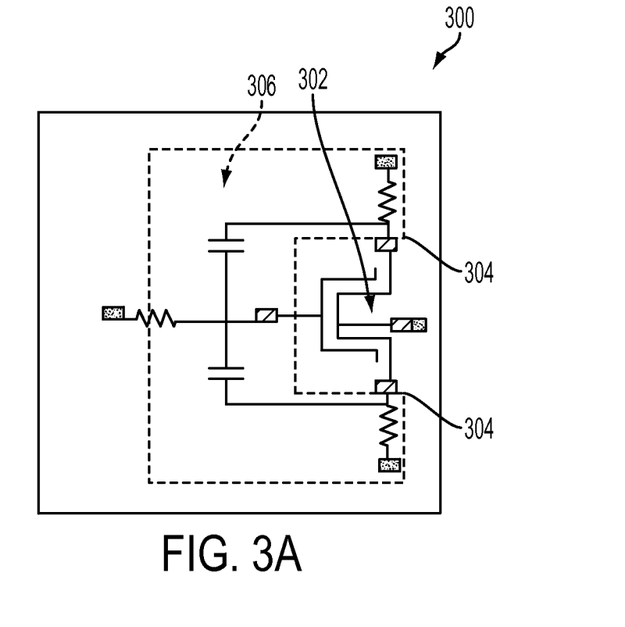
FIG. 3A is a schematic view of an n-type FinFET in a parasitic mode in accordance with one or more embodiments.

FIG. 3A is a schematic view of an n-type FinFET 300 in a parasitic mode in accordance with one or more embodiments. FinFET 300 is a p-cell schematic in parasitic mode. FinFET 300 includes an n-type transistor 302. Located near each of a source terminal and a drain terminal are PODEs 304. Resistors and capacitors 306, which represent the MEOL and BEOL connections of FinFET 300, surround transistor 302.

PODEs 304 are similar to dummy gate structures and are used to help simulate the actual performance of transistor 302 during operation. FinFET 300 includes two PODEs 304. In some embodiments, more or less than two PODEs 304 are included in FinFET 300. PODEs 304 are not actually part of transistor 302, but are used to simulate actual performance of the transistor.

Resistors and capacitors 306 reflect the performance of signals propagating through connections in FinFET 300. Resistors and capacitors 306 are not formed in the connections of FinFET 300, but help to simulate the actual speed of propagation, voltage level and current level of signals propagating through the connections of the FinFET.

Figure 3B:
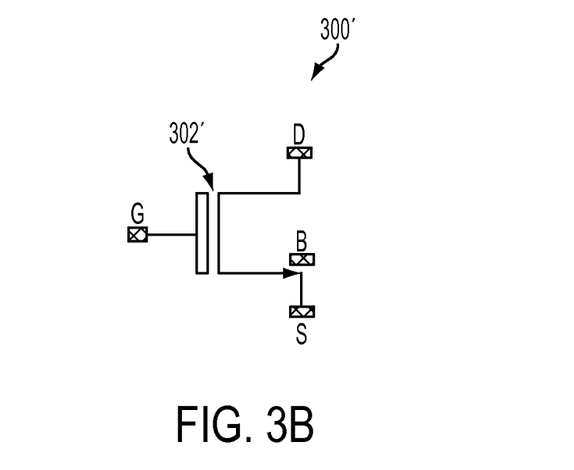
FIG. 3B is a schematic view of an n-type FinFET in a layout mode in accordance with one or more embodiments.

FIG. 3B is a schematic view of an n-type FinFET 300' in a layout mode in accordance with one or more embodiments. FinFET 300' is a p-cell schematic in layout mode. FinFET 300' includes a transistor 302' having a gate terminal G, a source terminal S, a drain terminal D, and a bulk terminal B. In comparison with FinFET 300 (FIG. 3A), FinFET 300' does not include PODEs 304 or resistors and capacitors 306. FinFET 300' is used to determine positioning and connections of transistor 302', not the electrical performance of the transistor. Therefore, FinFET 300' includes only elements which are actually formed during fabrication of transistor 302'.

Method 100 (FIG. 1) allows a circuit designer to easily switch between FinFET 300 (FIG. 3A) and FinFET 300' (FIG. 3B) to enable both electrical performance simulation and layout generation. The ability to easily switch between the different p-cell schematics enables the use of a single schematic design to save time and resources during circuit design. The ability to easily switch between the p-cell schematics also helps to reduce a number of iterations used during refining of the circuit design to satisfy the performance specification provided by the customer.

Figure 4:
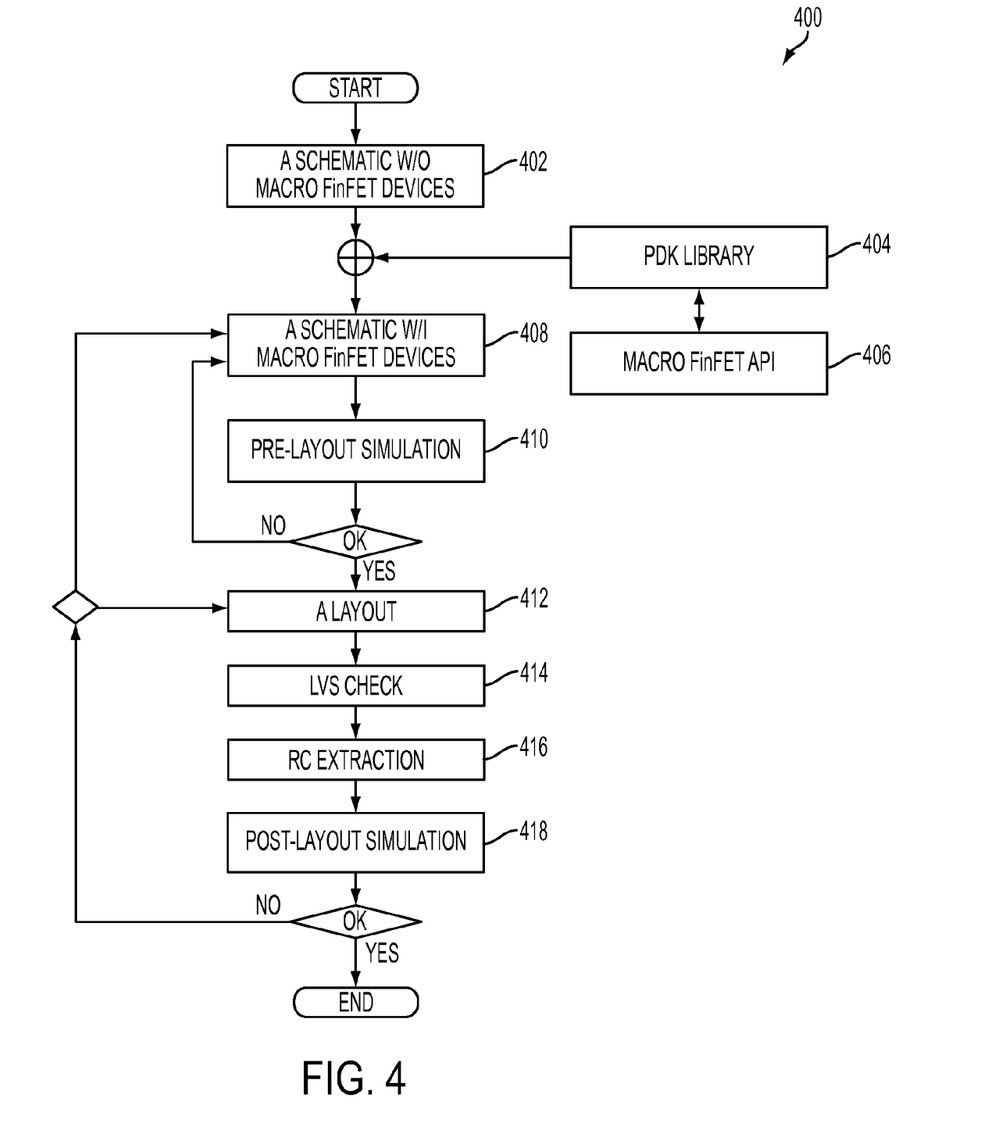
FIG. 4 is a flow chart of a method of designing a FinFET-based circuit in accordance with one or more embodiments.

FIG. 4 is a flow chart of a method 400 of designing a FinFET-based circuit in accordance with one or more embodiments. Method 400 begins with operation 402 in which a schematic design which does not include a macro FinFET devices is designed. A circuit designer receives a performance specification from a customer. The circuit designer creates the schematic design in order to satisfy the performance specification. The schematic design initially does not include artificial elements used to simulate the effect of neighboring devices and conductive elements in the schematic design.

A PDK library 404 is plugged in by a macro FinFET application programming interface (API) 406 and is combined with the schematic design in order to account for resistance and capacitance effects of elements within each FinFET device in the FinFET-based circuit. PDK library 404 is stored on a non-transitory computer readable medium. PDK library 404 includes native structures and connections of each FinFET device. PDK library 404 also includes a netlist wrapper. The netlist wrapper is used to control whether an intrinsic PDK netlist procedure or a macro FinFET netlist procedure is used to evaluate the FinFET device at each stage of method 400. A CDF is also part of PDK library 404. The CDF is adjustable based on modifications provided from macro FinFET API 406. In some embodiments, PDK library 404 is provided from an external source and is capable of being plugged in by macro FinFET API 406.

Macro FinFET API 406 is stored on a non-transitory computer readable medium. A netlist procedure in macro FinFET API 406 is used to plug in the netlist wrapper from PDK library 404 to include artificial elements such as PODE and resistance and capacitance elements of the MEOL and BEOL connections. RC bin values and RC equivalent equations are also stored in macro FinFET API 406. Macro FinFET API 406 also includes model cards for various FinFET devices. A model card includes information related to nodes electrically coupled to the FinFET device. In some embodiments, the model card further includes parasitic information related to the FinFET device. In some embodiments, macro FinFET API 406 is capable of plugging in PDK library 404 provided from an external source.

In contrast, with macro FinFET library 104 (FIG. 1), the combination of PDK library 404 and macro FinFET API 406 are directed to plugging in the netlist wrapper stored in the PDK library. By plugging in the netlist wrapper of PDK library 404, the net list wrapper in PDK library 404 includes both the artificial elements and an intrinsic PDK netlist which only includes elements which are actually formed during fabrication of the circuit. Plugging in the netlist wrapper of PDK library 404 also updates an RC mapping table stored in the PDK library. The updated RC mapping table enables accurate RC extraction and simulation of the FinFET device without requiring the circuit designer to switch between a parasitic mode and an intrinsic PDK netlist procedure mode.

In operation 408, a schematic design which includes macro FinFET parameters is developed. By combining PDK library 404 and macro FinFET API 406 with the schematic design from operation 402, FinFET devices within the schematic diagram are modified to include the artificial elements which help to simulate the RC performance of the FinFET devices. The macro FinFET parameters enable a more accurate simulation of performance of the circuit in comparison with the schematic design from operation 402 due to the inclusion of the artificial elements.

A pre-layout simulation is performed in operation 410. The pre-layout simulation generates electrical characteristics or functional characteristics which are used to compare a performance of the schematic design with the performance specification from the customer. In some embodiments, the pre-layout simulation includes comparing I-V curves or current gains between the schematic design and the performance specification. In some embodiments, the pre-layout simulation includes simulating an output of the schematic design in response to a simulated input. The output is then compared against the performance specification. In some embodiments, the pre-layout simulation is performed based on a combination of netlist wrapper from PDK library 404 and the netlist produce of macro FinFET API 406.

Following the pre-layout simulation, if the results pre-layout simulation satisfy the performance specification, method 400 continues to operation 412. If the results of the pre-layout simulation do not satisfy the performance specification, method 400 returns to operation 408 and the schematic design is revised.

In operation 412, a layout is generated. The layout is a physical location of the devices and connections in the schematic design. The layout does not include the artificial elements used to simulate the RC performance in pre-layout simulation. In some embodiments, the layout is generated using a GDS. In some embodiments, the layout includes multiple layers. In some embodiments, generating the layout includes designing masks which are used to pattern a wafer to form the circuit. In some embodiments, a number of masks is equal to a number of layers in the layout. In some embodiments, more than one mask is used to form at least one layer of the layout. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on the netlist wrapper from PDK library 404 without the modifications from the netlist procedure from macro FinFET API.

In some embodiments, a DRC is performed during generation of the layout to maintain sufficient spacing between features in the layout so that the layout can be precisely formed during a fabrication process. In some embodiments, a same tool used to generate the layout is used to perform the DRC. In some embodiments, the DRC is performed by a separate tool following generation of the layout.

In operation 414, an LVS check is performed. The LVS check compares the layout with the schematic design to help ensure the layout accurately represents the circuit as designed by the circuit designer. The LVS check does not account for the artificial elements in the schematic design. In some embodiments, the LVS check includes the netlist wrapper from PDK library 404 free of the netlist procedure from macro FinFET API 406. In some embodiments, the netlist wrapper is compared with the schematic design to determine whether the layout matches the schematic design.

In operation 416, an RC extraction is performed. In some embodiments, the RC extraction extracts electrical performance information from the layout. In some embodiments, the RC extraction is performed based on the netlist wrapper. In some embodiments, the RC extraction is performed based on an RC Mapping Table 504 (FIG. 5A) to help ensure that intrinsic PDK devices are annotated with accurate RC information during the RC extraction. In some embodiments, the RC extraction applies the extracted information to various device models to determine the electrical characteristics of the layout generated in operation 412. The RC extraction accounts for both the active devices and interconnect structures used to connect various active devices together. In some embodiments, a LPE is performed in combination with the RC extraction.

A post-layout simulation is performed in operation 418. The post-layout simulation determines the performance of the circuit in the layout of operation 412 and compares the performance with the performance specification received from the customer. In some embodiments, the post-layout simulation is performed using a post-layout simulator such as HSPICE® available from SYNOPSYS, Inc.; SPECTRE® available from CADENCE DESIGN SYSTEMS, Inc.; or other suitable post-simulation tools.

If the post-layout simulation determines that the layout satisfies the performance specification, the layout is transferred to the production stage to begin fabrication of masks used to create the layout. If the post-layout simulation determines that the layout does not satisfy the performance specification, at least one of the layout or the schematic design is revised to address the failure to satisfy the performance specification.

Similar to method 100 (FIG. 1), method 400 helps to reduce time and resources during designing of a FinFET-based circuit in comparison with methods which do not include the macro FinFET parameters. Instead of developing two separate schematic designs, the circuit designer develops a single schematic and a combination of PDK library 404 and macro FinFET API 406 are used to add the artificial elements to help simulate RC performance of the circuit. A PDK Library Netlist Wrapper 502 (FIG. 5A) allows switching between a netlist which includes the artificial elements in order to facilitate RC extraction and a netlist free of the artificial elements for an intrinsic pre-layout evaluation. A benefit of method 400 is that the method produces an accurate layout even if designers leave the schematic design in linking with macro FinFET API 406 to have the artificial elements or in adopting an intrinsic PDK elements without the artificial elements to automatically prevent from double counting parasitic RC values twice at RC extraction stage by using RC Mapping Table 504 inside PDK library 404.

Figure 5A:
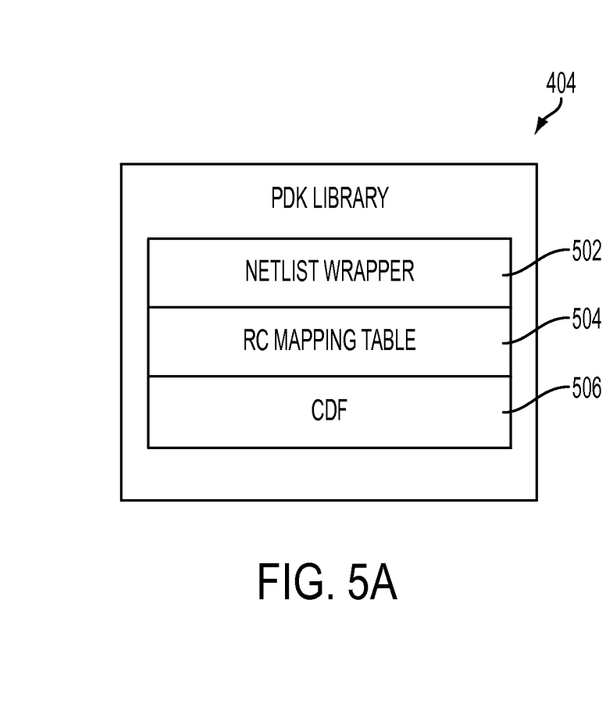
FIG. 5A is a block diagram of process design kit (PDK) library in accordance with one or more embodiments.
Figure 5B:
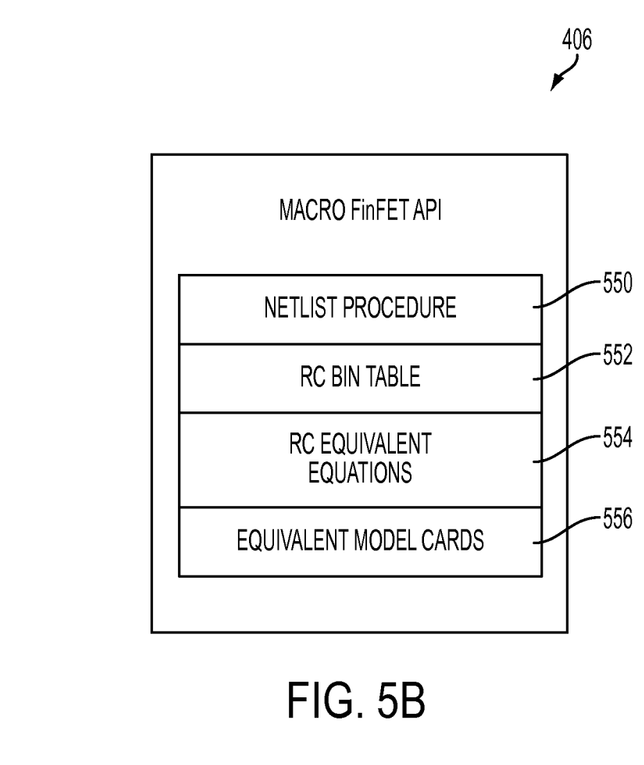
FIG. 5B is a block diagram of a macro FinFET application programming interface (API) in accordance with one or more embodiments.

FIG. 5 is a block diagram of PDK library 404 and macro FinFET API 406 in accordance with one or more embodiments. PDK library 404 is stored in a non-transitory computer readable medium. PDK library includes a netlist wrapper 502 which includes switching macro FinFET API's netlist procedure or intrinsic PDK netlist procedure. Netlist wrapper 502 is capable of being modified based on information received from macro FinFET API 406 to include the artificial elements in the netlist. An RC mapping table 504 is also included in PDK library 404. RC mapping table 504 is used to prevent from double counting parasitic RC values twice at RC extraction stage and to make sure back annotate intrinsic PDK devices at RC extraction stage. CDF 506 is also included in PDK library to help provide the native structure of the FinFET device. CDF 506 is able to be modified based on information from macro FinFET API 406 to include the artificial elements during RC performance simulation.

Macro FinFET API 406 includes a netlist procedure 550 used to plug in to netlist wrapper 502 to include the artificial elements during RC performance simulation of the FinFET device. RC bin values 552 stored in macro FinFET API 406 are determined using a simulation tool in combination with different configurations of the FinFET device. RC bin values 552 store initial RC parameter values for the artificial elements in the FinFET device. RC equivalent equations 554 stored in macro FinFET API 406 are used to determine the parasitic performance of the FinFET device. In some embodiment, RC equivalent equations 554 are linear. In some embodiments, RC equivalent equations 554 are non-linear. In some embodiments, RC equivalent equations 554 are used to interpolate between different RC bin values 552. Macro FinFET API 406 also includes equivalent model cards 556. Equivalent model cards 556 are used to store structure and performance data related to the FinFET device to increase the speed and precision of the circuit design.

Figure 6:
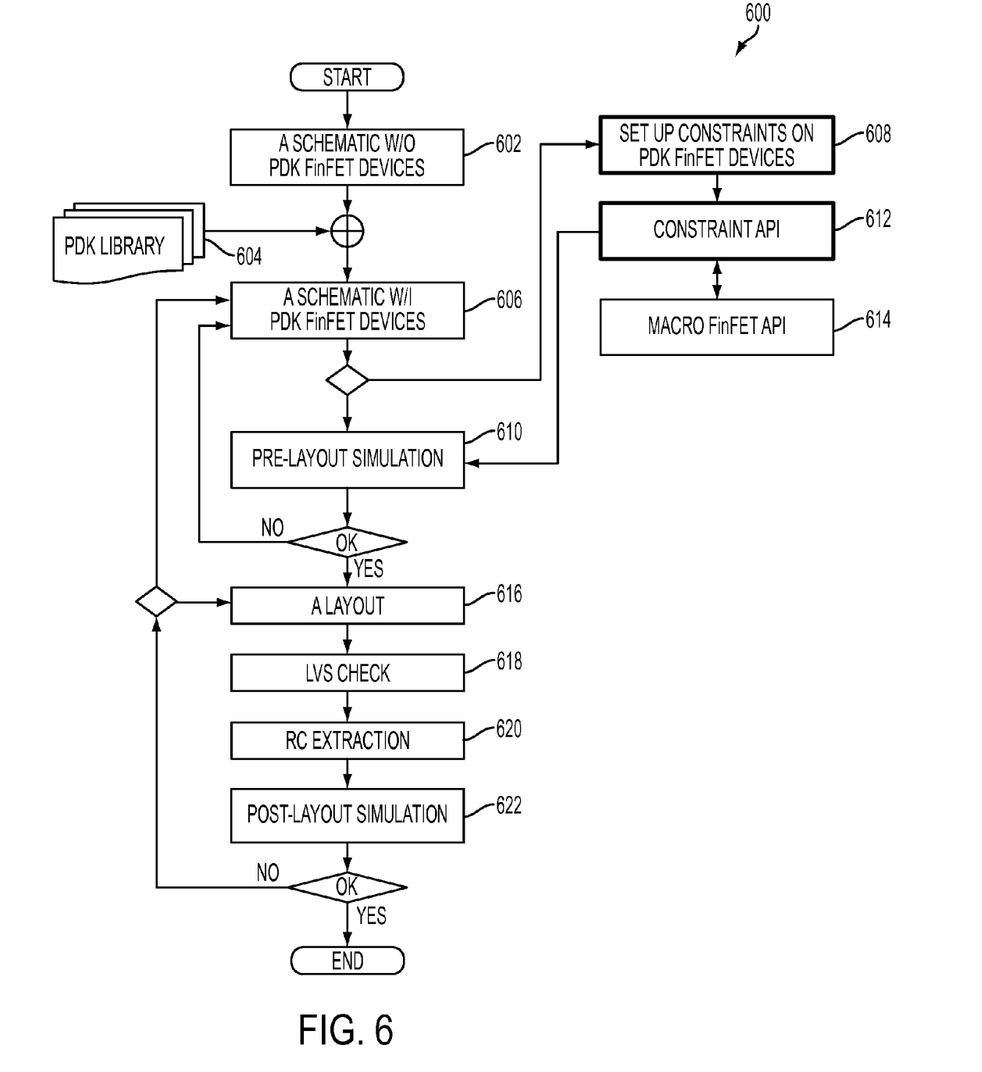
FIG. 6 is a flow chart of a method of designing a FinFET-based circuit in accordance with one or more embodiments.

FIG. 6 is a flow chart of a method 600 of designing a FinFET-based circuit in accordance with one or more embodiments. Method 600 begins with operation 602 in which a schematic design which does not include PDK FinFET devices is designed. A circuit designer receives a performance specification from a customer. The circuit designer creates the schematic design in order to satisfy the performance specification. The schematic design initially does not the specific structure of the FinFET devices used to simulate the effect of neighboring devices and conductive elements in the schematic design.

A PDK library 604 is combined with the schematic design in order to account for the structure of each FinFET device in the FinFET-based circuit. PDK library 604 is stored on a non-transitory computer readable medium. In some embodiments, PDK library 604 is similar to PDK library 404 (FIG. 4). In some embodiments, PDK library 604 is provided from an external source and is capable of being modified.

In operation 606, a schematic design which includes PDK FinFET devices is developed. By combining PDK library 604 with the schematic design in operation 602, a native structure of the FinFET devices are included in the schematic design.

Constraints are added to the PDK FinFET devices in operation 608 using an electronic design automation (EDA) tool. The EDA tool is used to analyze a circuit to determine a response of the circuit to an input. In some embodiments, the EDA tool is provided from an external source. In some embodiments, the constraints include accounting for artificial elements which help to precisely simulate the electrical performance of the FinFET device.

A pre-layout simulation is performed in operation 610. The pre-layout simulation generates electrical characteristics or functional characteristics which are used to compare a performance of the schematic design with the performance specification from the customer. The pre-layout simulation is performed based on a constrain API 612 which is plugged in by a macro FinFET API 614. Constraint API 612 is configured to interact with the constraints introduced into the PDK FinFET devices by the EDA tool. In some embodiments, constraint API 612 is provided by an external source. Constrain API 612 is implemented by the EDA tool. Constraint API 612 is configured to be modified by macro FinFET API 614 to include details related to the artificial elements. Macro FinFET API 614 is similar to macro FinFET API 406 (FIG. 4). In some embodiments, the pre-layout simulation includes comparing I-V curves or current gains between the schematic design and the performance specification. In some embodiments, the pre-layout simulation includes simulating an output of the schematic design in response to a simulated input. The output is then compared against the performance specification.

In contrast, with the combination of PDK library 404 (FIG. 4) and macro FinFET API 406, constraint API 612 and macro FinFET API 614 are applied only during pre-layout simulation to modify the artificial elements using the EDA tool. A benefit of method 600 is that double counting of RC components is avoided by limiting the use of the artificial elements to the pre-layout simulation. In some embodiments, constraint API 612 and macro FinFET API 614 do not modify a netlist within the PDK FinFET device.

Following the pre-layout simulation, if the results pre-layout simulation satisfy the performance specification, method 600 continues to operation 616. If the results of the pre-layout simulation do not satisfy the performance specification, method 600 returns to operation 610 and the schematic design is revised.

In operation 616, a layout is generated. The layout is a physical location of the devices and connections in the schematic design. The layout does not include the artificial elements defined by constraint API 612 and macro FinFET API 614 in pre-layout simulation. In some embodiments, the layout is generated using a GDS. In some embodiments, the layout includes multiple layers. In some embodiments, generating the layout includes designing masks which are used to pattern a wafer to form the circuit. In some embodiments, a number of masks is equal to a number of layers in the layout. In some embodiments, more than one mask is used to form at least one layer of the layout. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool.

In some embodiments, a DRC is performed during generation of the layout to maintain sufficient spacing between features in the layout so that the layout can be precisely formed during a fabrication process. In some embodiments, a same tool used to generate the layout is used to perform the DRC. In some embodiments, the DRC is performed by a separate tool following generation of the layout.

In operation 618, an LVS check is performed. The LVS check compares the layout with the schematic design to help ensure the layout accurately represents the circuit as designed by the circuit designer. The LVS check does not account for the artificial elements in the schematic design.

In operation 620, an RC extraction is performed. In some embodiments, the RC extraction extracts electrical performance information from the layout. In some embodiments, the RC extraction applies the extracted information to various device models to determine the electrical characteristics of the layout generated in operation 616. The RC extraction accounts for both the active devices and interconnect structures used to connect various active devices together. In some embodiments, a LPE is performed in combination with the RC extraction.

A post-layout simulation is performed in operation 622. The post-layout simulation determines the performance of the circuit in the layout of operation 616 and compares the performance with the performance specification received from the customer. In some embodiments, the post-layout simulation is performed using a post-layout simulator such as HSPICE® available from SYNOPSYS, Inc.; SPECTRE® available from CADENCE DESIGN SYSTEMS, Inc.; or other suitable post-simulation tools.

If the post-layout simulation determines that the layout satisfies the performance specification, the layout is transferred to the production stage to begin fabrication of masks used to create the layout. If the post-layout simulation determines that the layout does not satisfy the performance specification, at least one of the layout or the schematic design is revised to address the failure to satisfy the performance specification.

Similar to method 100 (FIG. 1), method 600 helps to reduce time and resources during designing of a FinFET-based circuit in comparison with methods which do not include the macro FinFET parameters. Instead of developing two separate schematic designs, the circuit designer develops a single schematic and a combination of constrained PDK library and macro FinFET API 614 are used to add the artificial elements to help simulate RC performance of the circuit using the EDA tool. The constrained PDK library allows inclusion of macro FinFET API 614 during a pre-layout simulation in order to facilitate precise electrical performance simulation, but does not include the macro FinFET API 614 information during layout generation and evaluation. The limited use of macro FinFET API 614 information helps to avoid a circuit designer inadvertently considering artificial elements during layout generation or evaluation to reduce the risk of considering the parasitic RC values twice, which would reduce the accuracy of simulation.

One of ordinary skill in the art would recognize that an order of operations in methods 100, 400 or 600 are able to be changed without departing from the scope of this description. One of ordinary skill in the art would also recognize that additional operations are able to be added or that operations are able to be removed without departing from the scope of this description.

Figure 7:
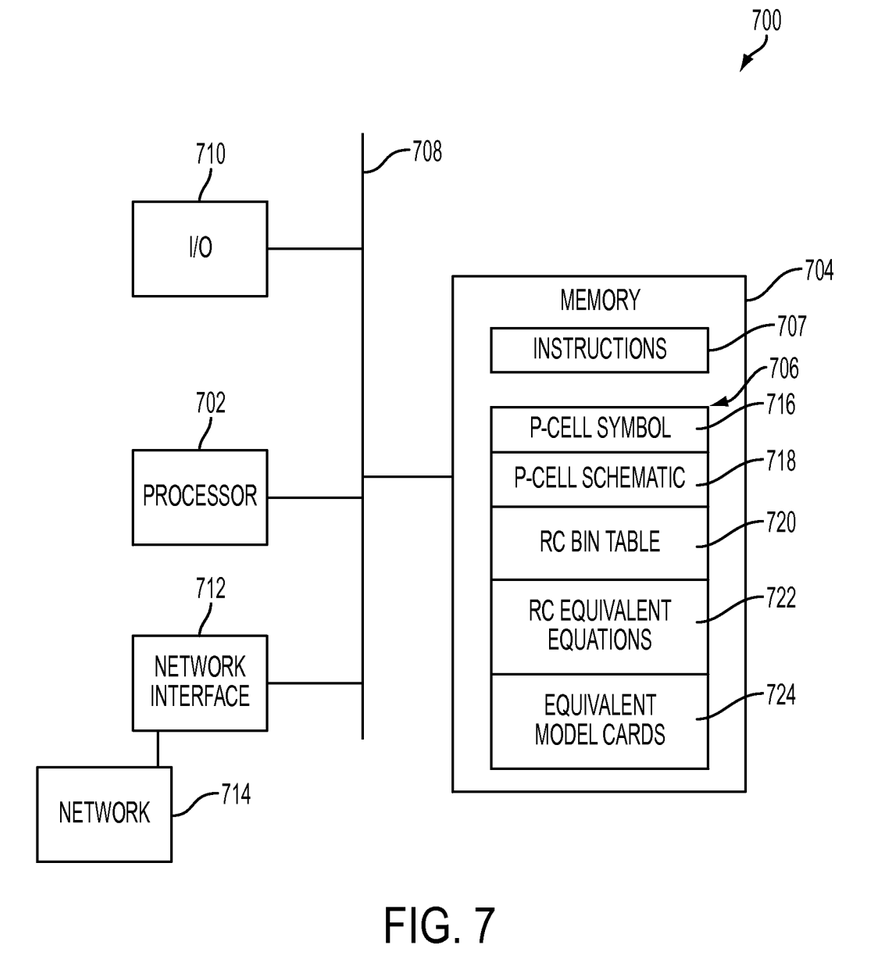
FIG. 7 is a block diagram of a general purpose computing device for designing a FinFET-based circuit in accordance with one or more embodiments.

FIG. 7 is a block diagram of a general purpose computing device 700 for designing a FinFET-based circuit in accordance with one or more embodiments. Computing device 700 includes a hardware processor 702 and a non-transitory, computer readable storage medium 704 encoded with, i.e., storing, the computer program code 706, i.e., a set of executable instructions. Computer readable storage medium 704 is also encoded with instructions 707 for interfacing with manufacturing machines for producing the memory array. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 704 in order to cause computing device 700 to be usable for performing a portion or all of the operations as described in method 100, method 400 or method 600.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 stores the computer program code 706 configured to cause computing device 700 to perform method 100, method 400 or method 600. In some embodiments, the storage medium 704 also stores information needed for performing a method 100, 400 or 600 as well as information generated during performing the method 100, 400 or 600, such as a p-cell symbol parameter 716, a p-cell schematic parameter 718, an RC bin value parameter 720, an RC equivalent equations parameter 722, an equivalent model cards parameter 724 or a set of executable instructions to perform the operation of method 100, 400 or 600.

In some embodiments, the storage medium 704 stores instructions 707 for interfacing with external machines. The instructions 707 enable processor 702 to generate instructions readable by the external machines to effectively implement method 100, 400 or 600 during a circuit design process.

Computing device 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

Computing device 700 also includes network interface 712 coupled to the processor 702. Network interface 712 allows computing device 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, method 100, 400 or 500 is implemented in two or more computing devices 700, and information such as FinFET device structure or electrical performance are exchanged between different computing devices 700 via network 714.

Computing device 700 is configured to receive information related to a circuit design from a circuit designer through I/O interface 710. The information is transferred to processor 702 via bus 708 to determine a type of FinFET device. A p-cell symbol of the FinFET device is then stored in computer readable medium 704 as p-cell symbol parameter 716. A p-cell schematic of the FinFET device is stored in computer readable medium 704 as p-cell schematic parameter 718. Computing device 700 is configured to receive RC information related the FinFET device through I/O interface 710. The information is stored in computer readable medium 704 as RC bin values parameter 720. Computing device 700 is configured to calculate information related RC equivalent equations. The information is stored in computer readable medium 704 as RC equivalent equations parameter 722. Computing device 700 is configured to calculate information model cards of the FinFET device. The information is stored in computer readable medium 704 as equivalent model card parameter 724.

One aspect of this description relates to a method of designing a fin field effect transistor (FinFET)-based circuit. The method includes designing, using a processor, a first circuit schematic design based on a performance specification, the first circuit schematic design is free of artificial elements, wherein the artificial elements are used to simulate electrical performance of the FinFET-based circuit. The method further includes modifying, using the processor, at least one device within the first circuit schematic design to form a second circuit schematic design taking the artificial elements into consideration. The method further includes performing a pre-layout simulation using the second circuit schematic and taking the artificial elements into consideration. The method further includes generating a layout, wherein the layout does not take the artificial elements into consideration, and performing a post-layout simulation, wherein the post-layout simulation does not take the artificial elements into consideration.

Another aspect of this description relates to a method of designing a fin field effect transistor (FinFET)-based circuit. The method includes designing, using a processor, a first circuit schematic design based on a performance specification, the first circuit schematic design is free of artificial elements, wherein the artificial elements are used to simulate electrical performance of the FinFET-based circuit. The method further includes modifying the first circuit schematic design using a macro FinFET library to form a second circuit schematic design including the artificial elements, wherein the second circuit schematic design is switchable between a parasitic mode and a layout mode different from the parasitic mode. The macro FinFET library includes a first parameter cell (p-cell) symbol associated with the parasitic mode, a second p-cell symbol associated with the layout mode, a first p-cell schematic associated with the parasitic mode, a second p-cell schematic associated with the layout mode, and resistance capacitance (RC) equivalent equations. The method further includes performing a pre-layout simulation using the second circuit schematic design in the parasitic mode and the RC equivalent equations. The method further includes generating a layout using the second circuit schematic design in the layout mode, and performing a post-layout simulation using the second circuit schematic design in the layout mode.

Still another aspect of this description relates to a system for designing a fin field effect transistor (FinFET)-based circuit. The system includes a processor, and a non-transitory computer readable medium connected to the processor. The non-transitory computer readable medium containing instructions for designing, using a processor, a first circuit schematic design based on a performance specification, the first circuit schematic design is free of artificial elements, wherein the artificial elements are used to simulate electrical performance of the FinFET-based circuit. The non-transitory computer readable medium further includes instructions for modifying, using the processor, at least one device within the first circuit schematic design to form a second circuit schematic design taking the artificial elements into consideration. The non-transitory computer readable medium further includes instructions for performing a pre-layout simulation using the second circuit schematic and taking the artificial elements into consideration. The non-transitory computer readable medium further includes instructions for generating a layout, wherein the layout does not take the artificial elements into consideration, and performing a post-layout simulation, wherein the post-layout simulation does not take the artificial elements into consideration.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of designing a fin field effect transistor (FinFET)-based circuit, the method comprising:
designing, using a processor, a first circuit schematic design based on a performance specification, the first circuit schematic design being free of artificial elements, wherein the artificial elements are used to simulate electrical performance of the FinFET-based circuit;
modifying, using the processor, at least one device within the first circuit schematic design to form a second circuit schematic design taking the artificial elements into consideration;
performing a pre-layout simulation using the second circuit schematic and taking the artificial elements into consideration;
generating a layout, wherein the layout does not take the artificial elements into consideration; and
performing a post-layout simulation, wherein the post-layout simulation does not take the artificial elements into consideration.

2. The method of claim 1, further comprising:
performing a layout versus schematic (LVS) check, wherein the LVS check does not take the artificial elements into consideration; and
performing an RC extraction, wherein the RC extraction does not take the artificial elements into consideration.

3. The method of claim 1, further comprising:
comparing results of the pre-layout simulation with the performance specification;
revising the second circuit schematic design if the results of the pre-layout simulation do not satisfy the performance specification; and
generating the layout if the results of the pre-layout simulation satisfy the performance specification.

4. The method of claim 1, wherein modifying the first circuit schematic design comprises combining the first circuit schematic design with a macro FinFET library, wherein the macro FinFET library includes information related to the artificial elements.

5. The method of claim 1, wherein modifying the first circuit schematic design comprises combining the first circuit schematic design with a combination of a process design kit (PDK) library and a macro FinFET application programming interface (API), wherein the PDK includes a structure of a FinFET device in the first circuit schematic design, and the macro FinFET API includes information related to the artificial elements.

6. The method of claim 5, further comprising plugging a netlist procedure in the macro FinFET API into a netlist wrapper in the PDK library to include the information related to the artificial elements.

7. The method of claim 1, further comprising:
establishing constraints on a PDK library; and
receiving electrical performance information for the artificial elements during the pre-layout simulation based on the constrain PDK library.

8. The method of claim 7, wherein receiving the electrical performance information comprises receiving the electrical performance information from a constraint API combined with a macro FinFET API.

9. A method of designing a fin field effect transistor (FinFET)-based circuit, the method comprising:
designing, using a processor, a first circuit schematic design based on a performance specification, the first circuit schematic design being free of artificial elements, wherein the artificial elements are used to simulate electrical performance of the FinFET-based circuit;
modifying the first circuit schematic design using a macro FinFET library to form a second circuit schematic design including the artificial elements, wherein the second circuit schematic design is switchable between a parasitic mode and a layout mode different from the parasitic mode, and the macro FinFET library includes a first parameter cell (p-cell) symbol associated with the parasitic mode, a second p-cell symbol associated with the layout mode, a first p-cell schematic associated with the parasitic mode, a second p-cell schematic associated with the layout mode, and resistance capacitance (RC) equivalent equations;
performing a pre-layout simulation using the second circuit schematic design in the parasitic mode and the RC equivalent equations;
generating a layout using the second circuit schematic design in the layout mode; and
performing a post-layout simulation using the second circuit schematic design in the layout mode.

10. The method of claim 9, wherein performing the pre-layout simulation includes using the first p-cell schematic which includes the artificial elements.

11. The method of claim 9, wherein modifying the first circuit schematic includes considering the artificial elements including at least one of a polysilicon oxide diffusion edge (PODE) element, middle end of line (MEOL) connections, or back end of line (BEOL) connections.

12. The method of claim 9, further comprising:
performing a layout versus schematic (LVS) check using the second circuit schematic design in the layout mode; and
performing an RC extraction using the second schematic design in the layout mode.

13. The method of claim 9, further comprising:
comparing results of the pre-layout simulation with the performance specification;
revising the second circuit schematic design if the results of the pre-layout simulation do not satisfy the performance specification; and
generating the layout if the results of the pre-layout simulation satisfy the performance specification.

14. The method of claim 9, further comprising:
comparing results of the post-layout simulation with the performance specification;
revising the second circuit schematic design and the layout if the results of the post-layout simulation do not satisfy the performance specification; and
fabricating masks of the layout if the results of the post-layout simulation satisfy the performance specification.

15. The method of claim 9, wherein performing the pre-layout simulation comprises using linear RC equivalent equations.

16. The method of claim 9, wherein performing the pre-layout simulation comprises using non-linear RC equivalent equations.

17. A system for designing a fin field effect transistor (FinFET)-based circuit, the system comprising:
a processor; and
a non-transitory computer readable medium connected to the processor, the non-transitory computer readable medium containing instructions configured to cause the processor to perform operations comprising:
designing a first circuit schematic design based on a performance specification, the first circuit schematic design being free of artificial elements, wherein the artificial elements are used to simulate electrical performance of the FinFET-based circuit;
modifying at least one device within the first circuit schematic design to form a second circuit schematic design taking the artificial elements into consideration;
performing a pre-layout simulation using the second circuit schematic and taking the artificial elements into consideration;
generating a layout, wherein the layout does not take the artificial elements into consideration; and
performing a post-layout simulation, wherein the post-layout simulation does not take the artificial elements into consideration.

18. The system of claim 17, wherein the non-transitory computer readable medium further comprises instructions for combining the first circuit schematic design with a macro FinFET library, wherein the macro FinFET library includes information related to the artificial elements.

19. The system of claim 17, wherein the non-transitory computer readable medium further comprises instructions for combining the first circuit schematic design with a combination of a process design kit (PDK) library and a macro FinFET application programming interface (API), wherein the PDK includes a structure of a FinFET device in the first circuit schematic design, and the macro FinFET API includes information related to the artificial elements.

20. The system of claim 19, wherein the non-transitory computer readable medium further comprises instructions for modifying a netlist wrapper in the PDK library using a netlist procedure in the macro FinFET API to include the information related to the artificial elements.

\* \* \* \* \*